(12) United States Patent
Busch

(10) Patent No.: US 6,370,034 B1
(45) Date of Patent: Apr. 9, 2002

(54) PRINTED CIRCUIT BOARD FOR ELECTRICAL DEVICES HAVING RF COMPONENTS, PARTICULARLY FOR MOBILE RADIO TELECOMMUNICATION DEVICES

(75) Inventor: Georg Busch, Ahaus (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/381,041
(22) PCT Filed: Mar. 12, 1997
(86) PCT No.: PCT/DE97/00490
  § 371 Date: Sep. 13, 1999
  § 102(e) Date: Sep. 13, 1999
(87) PCT Pub. No.: WO98/41066
  PCT Pub. Date: Sep. 17, 1998

(51) Int. Cl.[7] ................................................ H05K 1/14
(52) U.S. Cl. ....................... 361/792; 361/814; 361/818; 174/256
(58) Field of Search ...................... 361/792, 794, 361/816, 818, 814; 174/250, 256, 257, 262, 263, 266; 427/97, 98, 99

(56) References Cited

U.S. PATENT DOCUMENTS

| | | | | |
|---|---|---|---|---|
| 4,402,998 A | * | 9/1983 | Kumagai et al. | 427/97 |
| 5,357,225 A | * | 10/1994 | Mortensen | 333/161 |
| 5,451,720 A | * | 9/1995 | Estes et al. | 174/250 |
| 5,513,382 A | * | 4/1996 | Agahi Kesheh et al. | 455/83 |
| 5,568,107 A | | 10/1996 | Buuck et al. | |
| 5,768,109 A | * | 6/1998 | Gulick et al. | 361/794 |
| 5,797,084 A | * | 8/1998 | Tsuru et al. | 455/73 |
| 5,903,820 A | * | 5/1999 | Hagstrom | 455/82 |
| 6,112,060 A | * | 8/2000 | Lim et al. | 455/78 |

OTHER PUBLICATIONS

Ultra–Fine Feature Printed Circuits and Multi–Chip Modules, Chandler et al., pp. 90–98 (No date).
Film Redistribution Layer Technology, Boyko et al., pp. 302–305 (No date).
IBM Technical Disclosure Bulletin, vol. 36, Oct. 10, 1983.
A Low Cost, Multi–Layer FR4 Circuit Board for the RF and Microwave Circuits in a Fixed Wireless Access Residential Transceiver Unit, Broome, pp. 5/1–5/6 (No date).

* cited by examiner

Primary Examiner—Jeffrey Gaffin
Assistant Examiner—Hung Bui
(74) Attorney, Agent, or Firm—Bell, Boyd & Lloyd LLC

(57) ABSTRACT

A printed circuit board for electrical devices having RF components, particularly for mobile radio telecommunication devices, wherein to increase the packing density of electronic circuits and conductor-track structures on such circuit board, a "micro via" coating is initially applied to one or both sides of a printed circuit board assembly. This "micro via" coating then has, in particular, RF circuits and RF conductor-track structures applied to at least part of its surface. Finally, the RF circuits and RF conductor-track structures are protected in relation to an RF ground coating of the printed circuit board assembly by barrier areas arranged in an assembly coating, situated directly below the "micro via" coating, of the printed circuit board assembly against interfering influences which impair the RF parameters, to be set in each case, of the RF circuits and RF conductor-track structures.

14 Claims, 9 Drawing Sheets

LP1

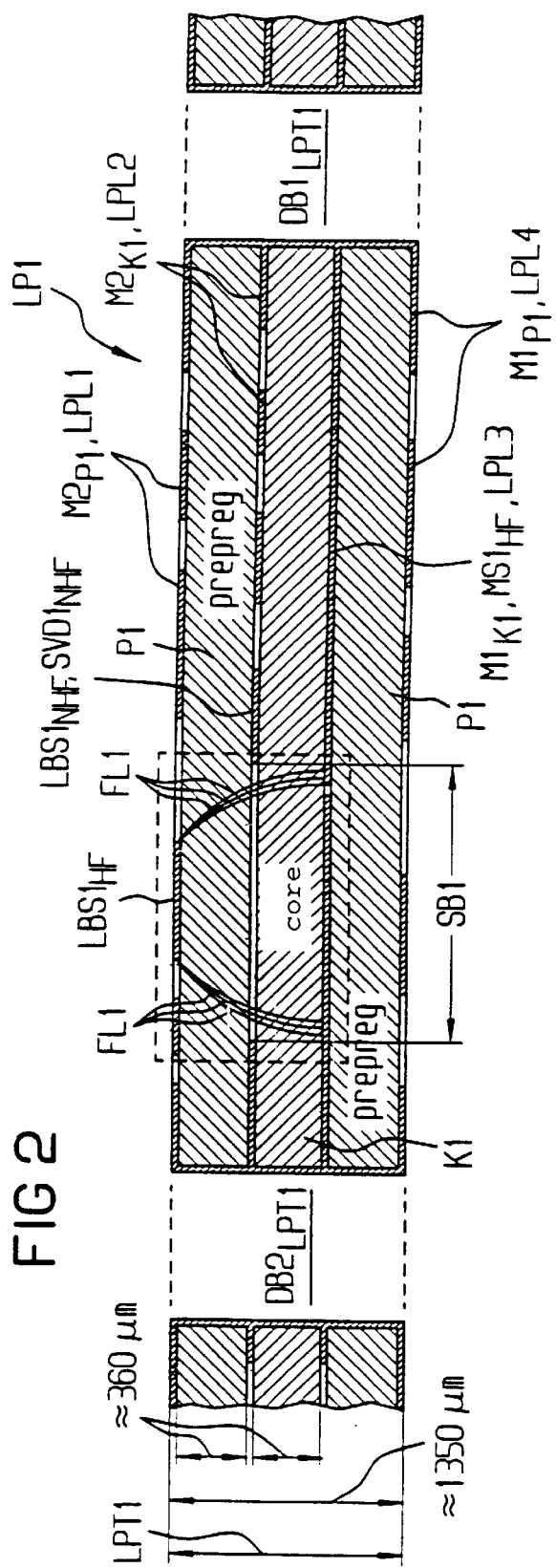

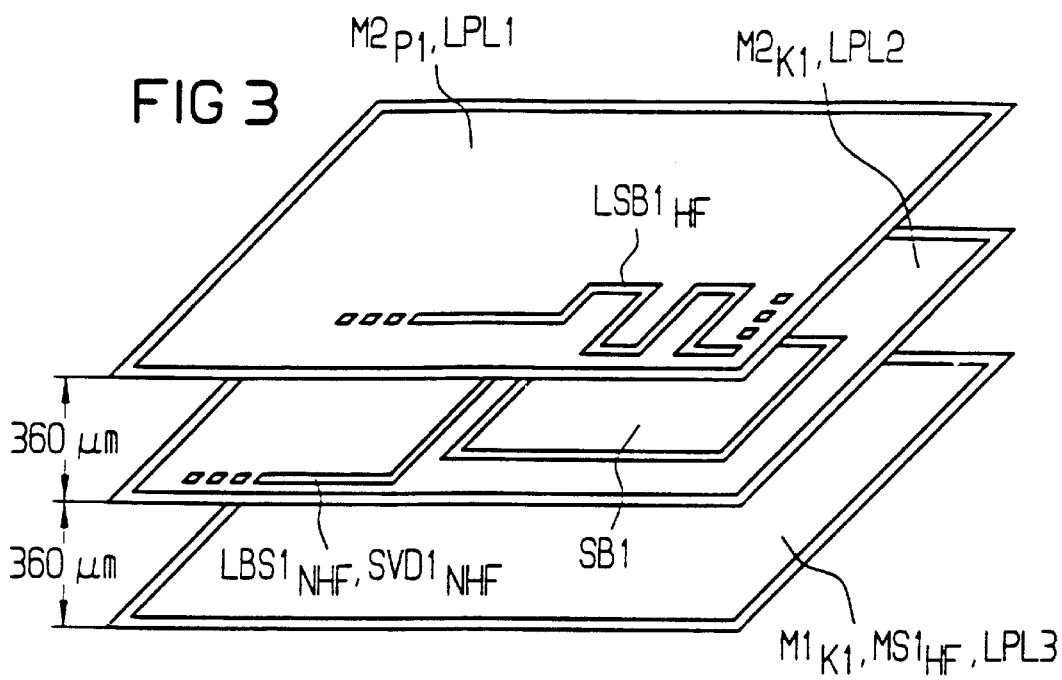
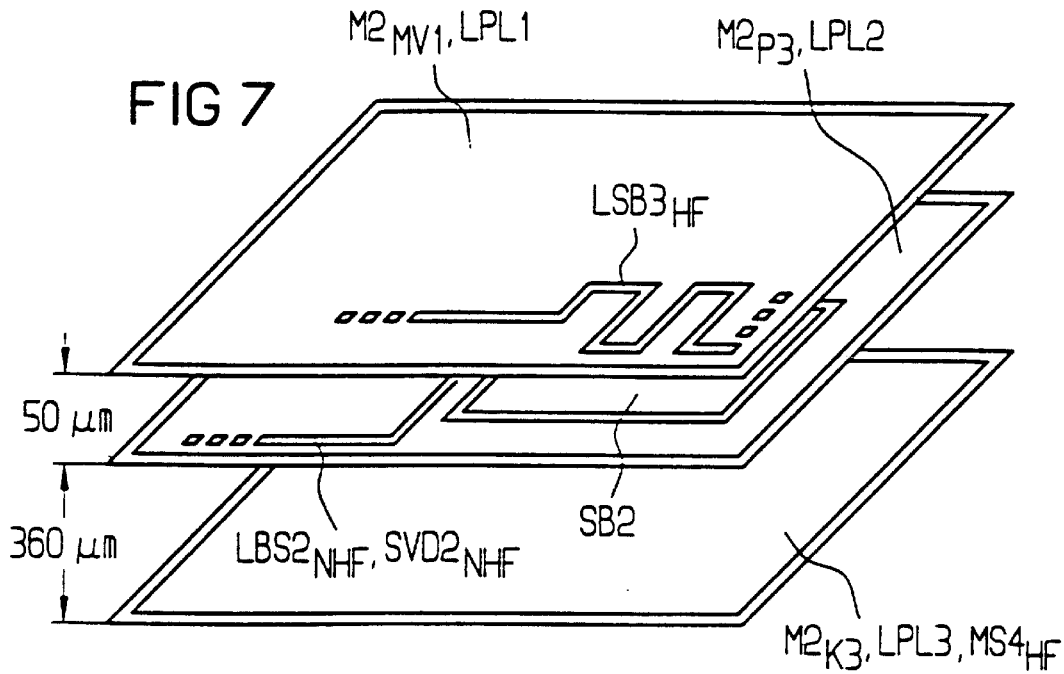

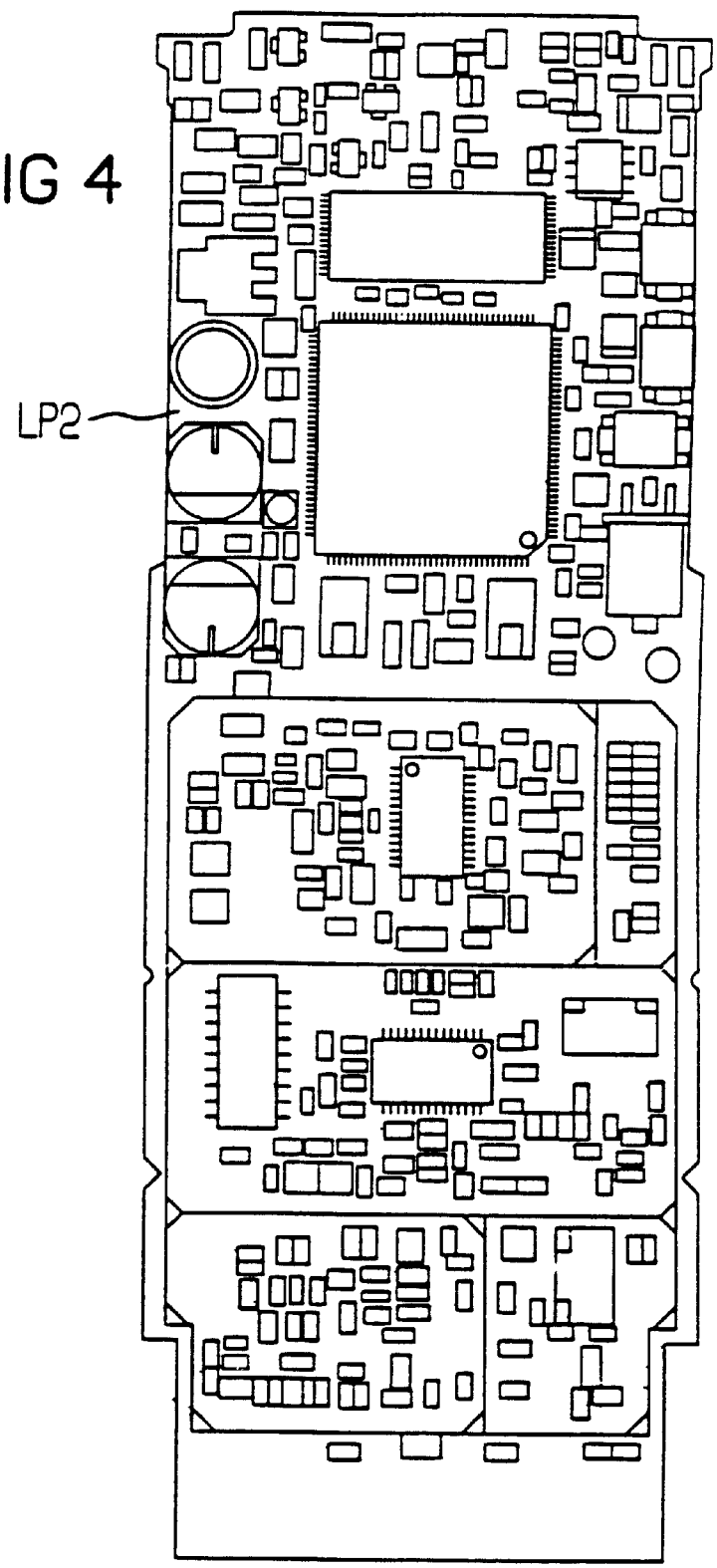

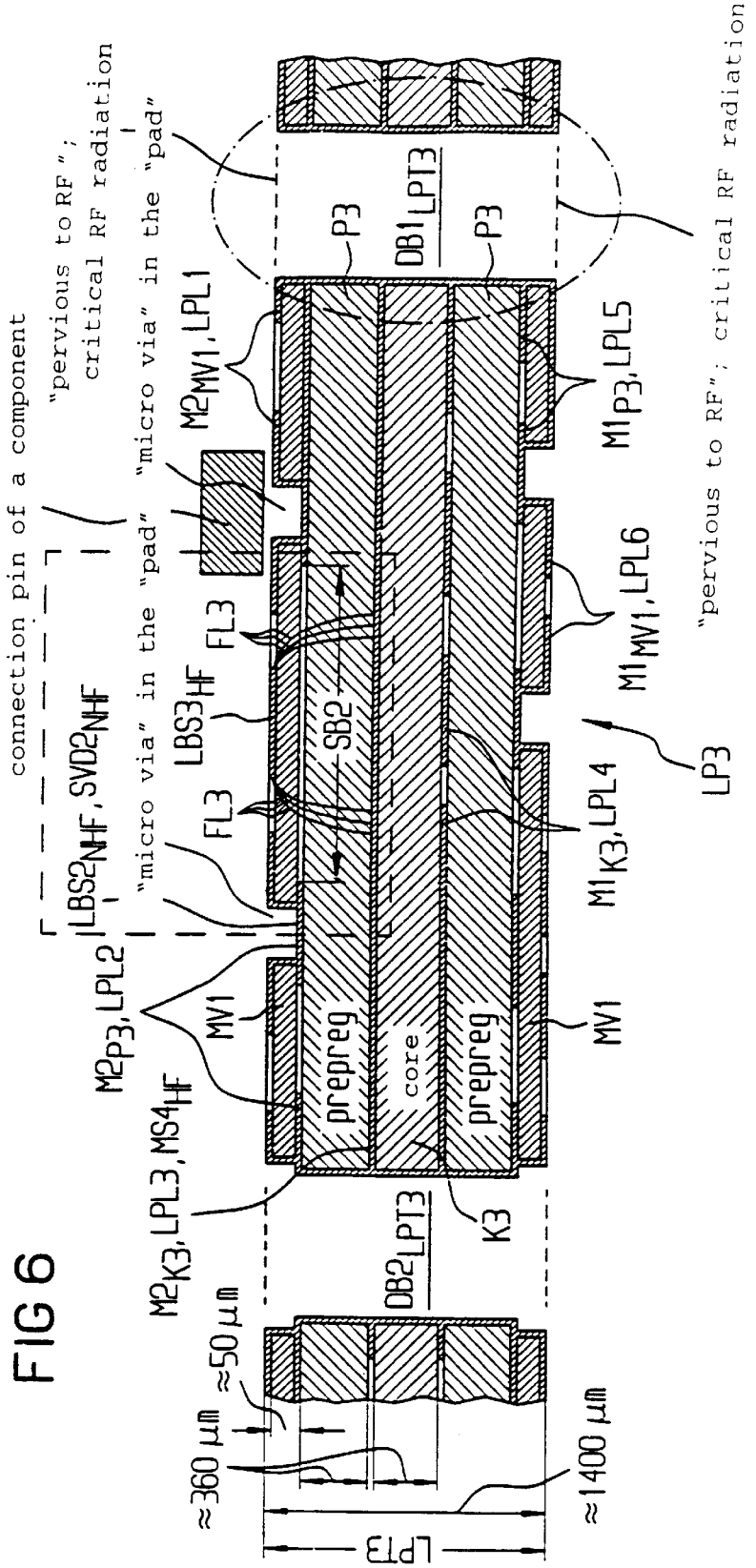

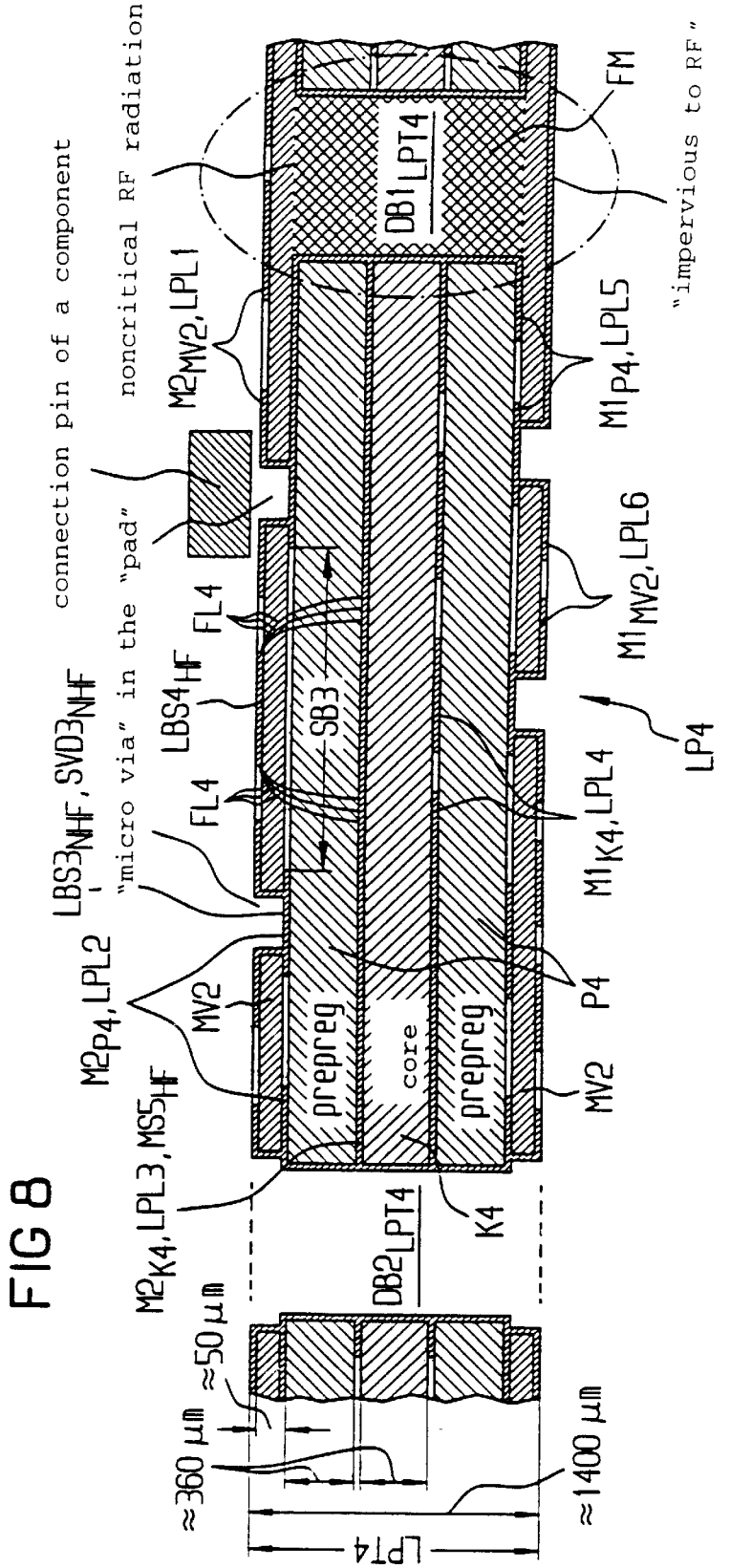

LP4

LPL4, has a thickness of approx. 1350 μm, and is preferably constructed using the known hybrid masslam process. The printed circuit board assembly LPT1 referred to here contains a first core K1 having a thickness of approx. 360 m, and having with a first metal coating $M1_{K1}$ (third printed circuit board layer LPL3) which is arranged on the underside of the core K1, is preferably made of copper. The first core K1 also has a second metal coating $M2_{K1}$ (second printed circuit board layer LPL2) which is arranged on the top of the core K1 and is preferably made of copper. The metal coatings $M1_{K1}$, $M2_{K1}$ have a respective first "prepreg" coating P1, with a thickness of in each case approx. 360 μm, arranged on them. The "prepreg" coatings denoted are glass fiber reinforced epoxy coatings. The "prepreg" coating PI arranged on the metal coating $M1_{K1}$ has, on the side opposite the metal coating $M1_{K1}$, a third metal coating $M1_{P1}$ (fourth printed circuit board layer LPL4) which is preferably made of copper and, on the side opposite the metal coating $M2_{K1}$, a fourth metal coating $M2_{P1}$ (first printed circuit board layer LPL1) which also is preferably made of copper. The first printed circuit board layer LPL1 has a critical first RF conductor-track structure $LBS1_{RF}$, for example, arranged in it, whilst the second printed circuit board layer LPL2 is provided with a first non-RF conductortrack structure $LBS1_{NRF}$ and/or a first non-RF circuit interconnection $SVD1_{NRF}$, for example. To protect the RF conductor-track structure $LBSL1_{RF}$ in relation to the RF ground coating $MS_{RF}$ in the third printed circuit board layer LPL3 from the influence of the non-RF conductor-track structure $LBS1_{NRF}$ and/or a first non-RF circuit interconnection $SVD1_{NRF}$, the second printed circuit board layer LPL2 is provided with a first barrier area SB1 which largely surrounds first field lines FL1 of the RF signal. Furthermore, the printed circuit board assembly LPT1 has first through holes $DB1_{LPT1}$ for RF connections and non-RF connections between the first printed circuit board layer LPL1 and the fourth printed circuit board layer LPL4, as well as second through holes $DB2_{LPT1}$ for connecting external modules (e.g. earpiece, microphone etc.).

PRINTED CIRCUIT BOARD FOR ELECTRICAL DEVICES HAVING RF COMPONENTS, PARTICULARLY FOR MOBILE RADIO TELECOMMUNICATION DEVICES

BACKGROUND OF THE INVENTION

1. Field of the Invention

The present invention relates to a printed circuit board for electrical devices having RF components, particularly for mobile radio telecommunication devices, wherein the printed circuit board has a "micro via" coating applied to it and includes RF circuits, non-RF circuits, RF conductor-track structures and non-RF conductor-track structures arranged on it.

2. Description of the Prior Art

In electrical devices having radio-frequency components or radio-frequency device parts (RF component; RF device parts), these RF components need [lacuna] to be separated from the non-RF components (e.g. AF components) or protected against reciprocal influences, on account of inter-reactions which arise between such components. This may occur because (1) the RF signals affect the AF response of the AF components if the latter are a placed too close to the RF components; (2) or when the AF components are placed too close to the RF components, the RF parameter settings of the RF components are affected. A typical location where RF components (RF circuits with RF interconnections and RF components) and non-RF components (non-RF circuits with non-RF interconnections and non-RF components) are arranged in close proximity to one another is a printed circuit board or electronic printed circuit board assembly in electrical devices. Furthermore, the interfering interaction between the components is accentuated in small electrical devices with small printed circuit boards. On the other hand, the demand for ever smaller and more compact electrical devices is increasing. This is particularly; the case where the miniaturized devices are portable i.e., the user can take them virtually anywhere (to any geographical location). One example of such small portable devices is mobile radio communication devices.

On the basis of the multiplicity of mobile radio telecommunication devices ( such as DECT telecommunication devices, GSM telecommunication devices, PHS telecommunication devices, "IS-95" telecommunication devices and other telecommunication devices based on pure or hybrid transmission methods from the basic transmission methods FDMA, TDMA, CDMA (e.g., the DS-CDMA method or the JD-CDMA method) which are used for a variety of message transmission purposes (such as the transmission of speech, packet and/or video data) and which give rise, by way of example, to the problems illustrated above relating to "demand for miniaturization on the one hand and avoidance of the interfering interaction between RF components and AF components on the other" in the context of the demand for cheaper and cheaper devices (i.e., mass-produced product), the following gives a representative illustration and explanation, for all the devices mentioned, of the effects produced thereby, using the example of a DECT mobile part.

FIG. 1 shows a first printed circuit board LP1, which is used in the Siemens "GIGASET 1000 S,C" DECT mobile part and, for production engineering reasons, is preferably fitted with components on one side. As shown in the cross section illustration in FIG. 2, the printed circuit board LP1 has a multilayer first printed circuit board assembly LPT1 which includes four printed circuit board layers LPL1 . . .

FIG. 3 shows an enlarged three-dimensional illustration of the region drawn in dashed lines in FIG. 2.

FIG. 4 shows a second printed circuit board LP2, used in the Siemens "GIGASET 2000 S,C" DECT mobile part and again, for production engineering reasons, preferably fitted with components on one side. As shown in the cross section illustration in FIG. 5, the printed circuit board LP2 has a multilayer second printed circuit board assembly LPT2, which again includes the four printed circuit board layers LPL1 . . . LPL4, has a thickness of approx. 1350 μm, and is preferably constructed using the known hybrid masslam process. The printed circuit board assembly LPT2 referred to here contains a second core K2 having a thickness of approx. 360 μm and having a fifth metal coating $M1_{K2}$ (third printed circuit board layer LPL3) which is arranged on the underside of the core K2 and is preferably made of copper.

The second core K2 also has a sixth metal coating $M2_{K2}$ (second printed circuit board layer LPL2) which is arranged on the top of the core K2, is preferably made of copper, and forms the second RF ground coating $MS2_{RF}$. The metal coating $M1_{K2}$, $M2_{K2}$ has a respective second "prepreg" coating P2, with a thickness of in each case approx. 360 μm, arranged on it. The "prepreg" coating P2 arranged on the metal coating $M1_{K2}$ has, on the side opposite the metal coating $M1_{K2}$, a seventh metal coating $M2_{P2}$ (fourth printed circuit board layer LPL4) which is preferably made of copper and, on the side opposite the metal coating $M2_{K2}$, an eighth metal coating $M2_{P2}$ (first printed circuit board layer LPL1), preferably made of copper. The printed circuit board layers LPL2 ... LPL4 have a known tri-plate structure arranged in them. This structure includes a critical second RF conductor-track structure $LBS2_{RF}$ in the third printed circuit board layer LPL3, the RF ground coating $MS2_{RF}$ in the second printed circuit board layer LPL2, and a third RF ground coating $MS3_{RF}$, which is amply designed for second field lines FL2 of the RF signal, in the fourth printed circuit board layer LPL4. Furthermore, the printed circuit board assembly LPT2 has first through holes $DB1_{LPT2}$ for the RF connections and non-RF connections between the first printed circuit board layer LPL1 and the fourth printed circuit board layer LPL4 as well as second through holes $DB2_{LPT2}$ for connecting the external modules (e.g. earpiece, microphone etc.).

To reduce the dimensions of the printed circuit boards LP1, LP2 and thus—as explained in the introduction—be able to produce more compact DECT mobile parts, it is known practice to fit components to both sides of the printed circuit boards. This, however, requires higher complexity in terms of production engineering.

When designing printed circuit boards for electrical devices without RF components, it is known practice to use "micro via" technology (Mv technology) in order to promote the abovementioned miniaturization of electrical devices. In printed circuit technology, "micro vias" denote plated-through holes on printed circuit boards in the order of micrometers. MV technology is an alternative to mechanically plating-through blind holes, which is likewise known. MV technology is a connection technology for cheaply producing printed circuit boards without RF circuits and RF conductor-track structures. The cost saving is achieved by virtue of the fact that not only mechanical drilling operations for blind holes, and the addition and removal of material, but also the deburring of the holes, are dispensed with. A number of production processes for producing such "micro via" coatings with a large area are currently known. These processes are the "Sequential Built Up" process (SBU process), the "Silver Bump" process (SB process), the plasma etching process, laser drilling with a $CO_2$ laser and laser drilling with a YAG laser. For large-scale use, the cost aspect (economic viability) means that, from a modern perspective, probably only the first two production processes can be considered. The "micro vias" (plated-through holes) produced using this technology have a diameter of 50 to 150 $\mu$m, for example, and require soldering lands, for example, with diameters in the range between 0.12 and 0.35 mm. The "micro via" diameter is again dependent on the distance between the "micro via" coating ("micro via" layer) and the nearest coating (layer) further that have 4 diameter/layer spacing>1. In combination with the very fine conductor technology having conductor-track widths of 50 $\mu$m, extremely high wiring densities are achieved.

In the case of standard technologies (e.g., blind-hole plated-through holes) known as an alternative to MV technology, the size of a printed circuit board is determined to a considerable extent by the space requirement for the plated-through holes and by the conductor-track structure on the component side of the printed circuit board. Since it is possible, with MV technology, to "dip down" to the first inner layer directly in the "pad" of the components, the space requirement for plated-through holes and conductor-track structures is now of only little consequence. As long as RF problems are not an issue, components may be placed as close to one another as is permitted from a production engineering perspective. On the above premise, with MV technology, the printed circuit board size is determined almost exclusively by the number and type of the components used.

The object on which the present invention is based, therefore, is to increase the packing density of electronic circuits and conductor-track structures on printed circuit boards for electrical devices having RF components, particularly for mobile radio telecommunication devices, and hence to reduce the dimensions of the printed circuit board.

SUMMARY OF THE INVENTION

The present the invention therefore considers applying a "micro via" coating to one or both sides of a printed circuit board assembly, applying the device-specific circuits with circuit interconnections and components as well as conductor-track structures (e.g. RF circuits having RF circuit interconnections and RF components as well as RF conductor-track structures or non-RF circuits having non-RF circuit interconnections and non-RF components and non-RF conductor-track structures to at least part of the surface of this "micro via" coating, and protecting the RF circuits and RF conductor-track structures in relation to an RF ground coating of the printed circuit board assembly by means of barrier areas, or so-called windows, arranged in an assembly layer and situated directly below the "micro via" coating, of the printed circuit board assembly from interfering influences which impair the RF parameters, to be set in each case, of the RF circuits and RF conductor-track structures (e.g., from the non-RF conductor-track structures and/or non-RF circuit interconnections likewise arranged on the assembly coating, situated directly below the "micro via" coating, of the printed circuit board assembly).

The procedure described above for constructing a printed circuit board is also valid, or also can be used if (unlike the above embodiments) on the one hand the RF circuit interconnections of the RF circuits and RF conductor-track structures on the assembly coating, situated directly below the "micro via" coating, of the printed circuit board assembly, and on the other hand the barrier areas and the RF components of the RF circuits, the non-RF conductor-track structures and/or the non-RF circuits with the circuit interconnections. and components, are arranged on the "micro via" coating. Furthermore, the two procedures may also be combined.

When using "micro via" technology and the window technique, it must be accepted, for a specific packing volume of circuits and conductor-track structures on the printed circuit board, that the number of printed circuit board layers is increased in comparison with a technology which does not use "micro via" technology and the window technique. However, the number of printed circuit board layers can be kept unchanged as compared with a technology not using "micro via" technology and the window technique only if, contrary to the objective on which the present invention is based, the packing density is reduced and, hence, the intended reduction (miniaturization) of the electrical device is not achieved.

If a printed circuit board for electrical devices having RF components, particularly for mobile radio telecommunication devices, is constructed using the proposed method, however, the space required for accommodating the device-specific circuits and conductor-track structures on the printed circuit board is significantly smaller than on printed circuit boards of conventional design.

The rest of the procedure according to an embodiment of the present invention affords the advantage that—if the distance between the "micro via" coating and the assembly coating, situated directly below the "micro via" coating, of the printed circuit board assembly is of the order of magnitude necessary for cheaply producing a "micro via" coating using the known "Sequential Built Up" process (SBU process)—in addition to the smaller printed circuit board design on account of the higher packing density, the production costs for the printed circuit board are drastically reduced.

A further development of the present invention allows, for example on the basis of the "hole diameter of a "micro via" relating to the distance between the "micro via" coating and the assembly coating, situated directly below the "micro via" coating, of the "printed circuit board assembly" condition, with typical hole diameters of between 50 $\mu$m and 150 $\mu$m, the ratio of the hole diameter to the layer spacing to be greater than 1, and requires soldering land diameters of between 0.12 mm and 0.35 mm.

As a result of another development of the present invention, a further reduction in the size of the printed circuit board design is possible because the RF circuit, which additionally can be applied to the "micro via" coating covering the first holes ("standard vias"), can be used to increase the packing density further.

Yet another development of the present invention ensures that, when the first holes in the "micro via" coating are covered, the micro-environment produced in the holes as a result of covering does not cause any blowing (explosion).

Additional features and advantages of the present invention are described in, and will be apparent from, the Detailed Description of the Preferred Embodiments and the Drawing.

DESCRIPTION OF THE DRAWING

FIG. 2 is a cross section illustration of the printed circuit board of FIG. 1;

FIG. 3 shows an enlarged three-dimensional view of the region drawn in dashed lines in FIG. 2;

FIG. 4 shows another known printed circuit board used in a DECT mobile part;

FIG. 6 shows a printed circuit board in accordance with the teachings of the present invention;

FIG. 7 shows an enlarged three-dimensional view of the region shown by dashed lines in FIG. 6;

FIG. 8 shows an alternative embodiment of a printed circuit board of the present invention;

DETAILED DESCRIPTION OF THE PREFERRED EMBODIMENTS

Figure 1:
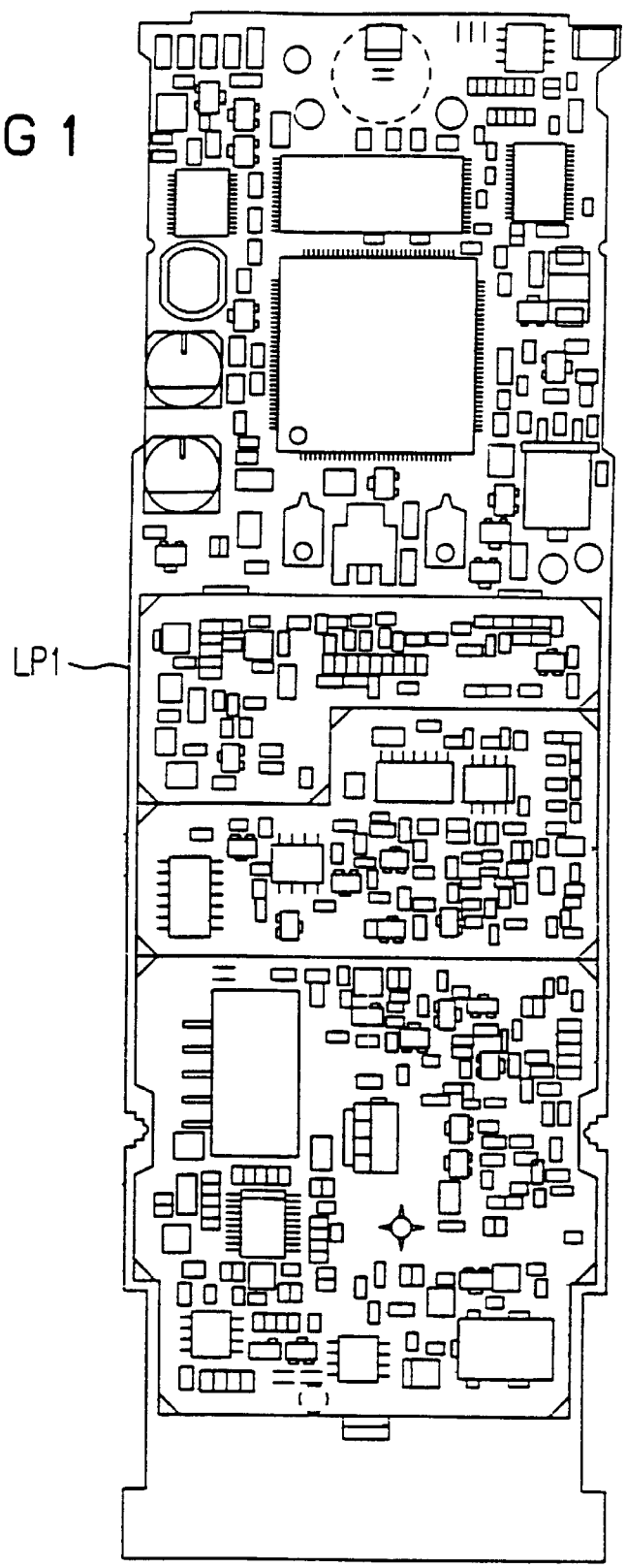
FIG. 1 shows a known printed circuit board which is used in a DECT mobile part.
Figure 5:
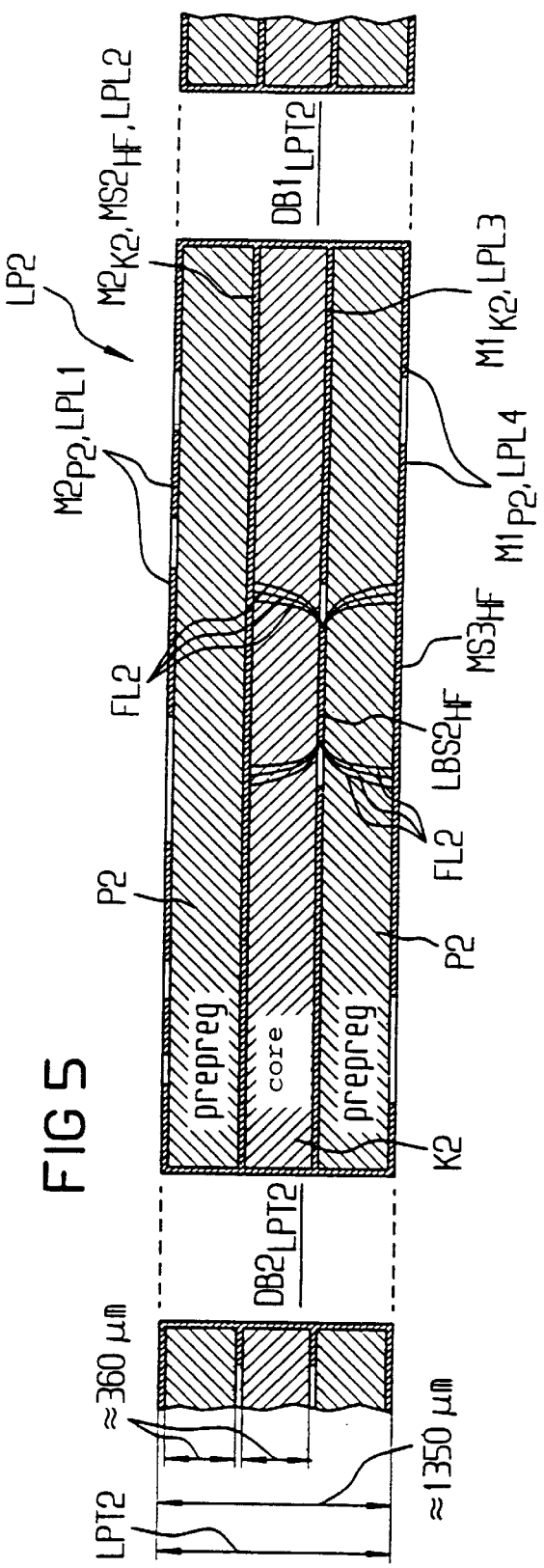
FIG. 5 is a cross section illustration of the printed circuit board of FIG. 4.

FIG. 6 shows in accordance with the teachings of the present invention, a third printed circuit board LP3, which is modified from the circuit boards LP1, LP2 by the use of MV technology in connection with the window technique matched to it and for production engineering reasons is preferably again fitted with components on one side. It is also possible for components to be fitted on both sides, however. This would make the dimensions of the printed circuit board LP3 even smaller. As shown in the cross section illustration in FIG. 6, and by comparison with the printed circuit board assemblies LPT1, LPT2 having the printed circuit board layers LPL1 ... LPL4 in FIGS. 2 and 5, the printed circuit board LP3 with a thickness of approximately 1400 $\mu$m has a multilayer third printed circuit board assembly LPT3, which includes four printed circuit board layers LPL2 ... LPL5 and whose printed circuit board layers LPL2 ... LPL5 are again preferably constructed using the known hybrid masslam process. Unlike the printed circuit boards LP1, LP2 having the printed circuit board assemblies LPT1, LPT2, the outer coating on the top of the printed circuit board assembly LPT3 and the outer coating on the underside of the printed circuit board assembly LPT3 are each provided with a further printed circuit board layer LPL1, LPL6, constructed using MN technology. The printed circuit board assembly LPT3 contains a third core K3 having a thickness of approx. 360 m and having a ninth metal coating $M1_{K3}$ (fourth printed circuit board layer LPL4), which is arranged on the underside of the core K3 and is preferably made of copper the third core K3 also has a tenth metal coating $M2_{K3}$ (third printed circuit board layer LPL3) which is arranged on the top of the core K3, is preferably made of copper and is designed as the fourth RF ground coating $MS4_{RF}$. The metal coatings $M1_{K3}$, $M2_{K3}$ each have a third "prepreg" coating P3, with a thickness of in each case approximately 360 $\mu$m, arranged on them. The "prepreg" coating P3 arranged on the metal coating $M1_{K3}$ has, on the side opposite the metal coating $M1_{K3}$, an eleventh metal coating $M1_{P3}$ (fifth printed circuit board layer LPL5), preferably made of copper and, on the side opposite the metal coating $M2_{K3}$, a twelfth metal coating $M2_{P3}$ (second printed circuit board layer LPL2), preferably made of copper.

The metal coatings $M1_{P3}$, $M2_{P3}$ each have a first "micro via" coating MV1, with a thickness of in each case approximately 50 $\mu$m, arranged on them. The "micro via" coating MV1 arranged on the metal coating $M1_{P3}$ has, on the side opposite the metal coating $M1_{P3}$, a thirteenth metal coating $M1_{MV1}$ (sixth printed circuit board layer LPLG) which is preferably made of copper and, on the side opposite the metal coating $M2_{P3}$, a fourteenth metal coating $M2_{MV1}$, (first printed circuit board layer LPL1), preferably made of copper. The first printed circuit board layer LPL1 has a critical third RF conductor-track structure $LBS3_{RF}$ for example, arranged in it, whilst the second printed circuit board layer LPL2 is provided with a second non-RF conductor-track structure $LBS2_{NRF}$ and/or a second non-RF circuit interconnection $SVD2_{NRF}$, for example. To protect the RF conductor-track structure $LBS3_{RF}$ in relation to the RF ground coating $MS4_{RF}$ in the third printed circuit board layer LPL3 against the influence of the non-RF conductor-track structure $LBS2_{NRF}$ and/or the non-RF circuit interconnection $SVD2_{NRF}$ the second printed circuit board layer LPL2 is provided with a second barrier area SB2, which largely surrounds third field lines FL3 of the RF signal.

The RF conductor-track structure $LBS2_{RF}$ also be may, alternatively or additionally, arranged in the second printed circuit board layer LPL2, the fifth printed circuit board layer LPL5 and/or the sixth printed circuit board layer LPL6. In the latter instance, the barrier area would logically have to be situated in the fifth printed circuit board layer LPL5. In the first two instances, the barrier areas would be situated in the first printed circuit board layer LPL1 and in the sixth printed circuit board layer LPL6, respectively.

Furthermore, the printed circuit board assembly LPT3 has first through holes $DB1_{LPT3}$ for RF connections and non-RF connections between the first printed circuit board layer LPL1 and the sixth printed circuit board layer LPL6, as well as second through holes $DB2_{LPT3}$ for connecting external modules (e.g. earpiece, microphone etc.). If, in particular, the through holes DB1$_{LPT3}$ as illustrated remain open, then these holes leak RF radiation (undesirable effect) produced by the RF circuits and RF conductor-track structures on the printed circuit board. FIG. 7 shows an enlarged three-dimensional illustration of the region shown by dashed lines in FIG. 6.

FIG. 8 shows a fourth printed circuit board LP4, which is slightly modified from the printed circuit boards LP3 in FIG. 6 and, for production engineering reasons, is preferably again fitted with components on one side. Once components can be fitted on both sides here. As shown in the cross section illustration in FIG. 8 and by comparison with the printed circuit board assembly LPT3 in FIG. 6, the printed circuit board LP4 with a thickness of approximately 1400 μm has a multilayer fourth printed circuit board assembly LPT4, which again includes the four printed circuit board layers LPL2 . . . LPL5 and which is again preferably constructed using the known hybrid masslam process, and has the two printed circuit board layers LPL1, LPL6 constructed using MV technology.

The printed circuit board layer LPL1 is situated on the outer coating on the top of the printed circuit board assembly LPT4, whilst the printed circuit board layer LPL6 is situated on the outer coating on the underside of the printed circuit board assembly LPT4. The printed circuit board assembly LPT4 then contains a fourth core K4 having a thickness of approximately 360 μm and having a fifteenth metal coating M1$_{K4}$ (fourth printed circuit board layer LPL4), which is arranged on the underside of the core K4 and is preferably made of copper. The fourth core K4 also has a sixteenth metal coating M2$_{K4}$ (third printed circuit board layer LPL3) which is arranged on the top of the core K4, is preferably made of copper, and is designed as the fifth RF ground coating MS5$_{RF}$. The metal coatings M1$_{K4}$, M2$_{K4}$ each have a fourth "prepreg" coating P4, with a thickness of in each case approximately 360 μm, arranged on them. The "prepreg" coating P4 arranged on the metal coating M1$_{K4}$ has, on the side opposite the metal coating M1$_{K4}$, a seventeenth metal coating M1$_{P4}$ (fifth printed circuit board layer LPL5), preferably made of copper and, on the side opposite the metal coating M2$_{K4}$, an eighteenth metal coating M2$_{P4}$ (second printed circuit board layer LPL2), preferably made of copper. The metal coatings M1$_{P4}$, M2$_{P4}$ each have a second "micro via" coating MV2 having a thickness of in each case approximately 50 μm, arranged on them. The "micro via" coating MV2 arranged on the metal coating M1$_{P4}$ has, on the side opposite the metal coating M1$_{P4}$, a nineteenth metal coating M1$_{MV2}$ (sixth printed circuit board layer LPL6), preferably made of copper and, on the side opposite the metal coating M2$_{P4}$, a twentieth metal coating M2$_{MV2}$ (first printed circuit board layer LPL1), preferably made of copper. The first printed circuit board layer LPL1 has a critical fourth RF conductor-track structure LBS4$_{RF}$, for example, arranged in it, whilst the second printed circuit board layer LPL2 is provided with a third non-RF conductor-track structure LBS3$_{NRF}$ and/or a third non-RF circuit interconnection SVD3$_{NRF}$, for example. To protect the RF conductor-track structure LBS4$_{RF}$ in relation to the RF ground coating MS$_{RF}$ in the third printed circuit board layer LPL3 against the influence of the non-RF conductor-track structure LBS3$_{NRF}$ and/or the non-RF circuit interconnection SVD3$_{NRF}$, the second printed circuit board layer LPL2 is provided with a third barrier area SB3, which largely surrounds fourth field lines FL4 of the RF signal.

The RF conductor-track structure LBS4$_{RF}$ also may be, again alternatively or additionally, arranged in the second printed circuit board layer LPL2, the fifth printed circuit board layer LPL5 and/or the sixth printed circuit board layer LPL6. In the latter instance, the barrier area would logically have to be situated in the fifth printed circuit board layer LPL5. In the first two instances, the barrier areas would be situated in the first printed circuit board layer LPL1 and in the sixth printed circuit board layer LPL6, respectively.

Furthermore, the printed circuit board assembly LPT4 has first through holes DB1$_{LPT4}$ for RF connections and non-RF connections between the first printed circuit board layer LPL1 and the sixth printed circuit board layer LPL6, as well as second through holes DB2$_{LPT4}$ for connecting external modules (e.g. audio unit, microphone etc.). In contrast to the circumstances in FIG. 6, the through holes DB1$_{LPT4}$ are as illustrated closed by the "micro via" coating MV2 with the metal coating M1$_{MV2}$ and with the metal coating M2$_{MV2}$. Whilst this measure creates additional space for RF circuits and RF conductor-track structures on the metal coating M2$_{MV2}$ (further increasing the packing density), the fact that the metal coating M1$_{MV2}$ is designed as a continuous ground coating means that the holes are made "impervious to RF" on the metal coating M1$_{MV2}$, so that no RF radiation produced by the RF circuits and RF conductor-track structures on the printed circuit board can now leak from this part of the lacuna hole opening. Since an RF circuit or an RF conductor-track structure is placed over the other hole opening, the RF radiation leaking from this is not critical.

So that the hole DB$_{LPT4}$ covered in this way does not blow out when covered, as a result of the micro-environment this produces in the hole, the hole is preferably filled up with a filling material Fm.

Figure 9:
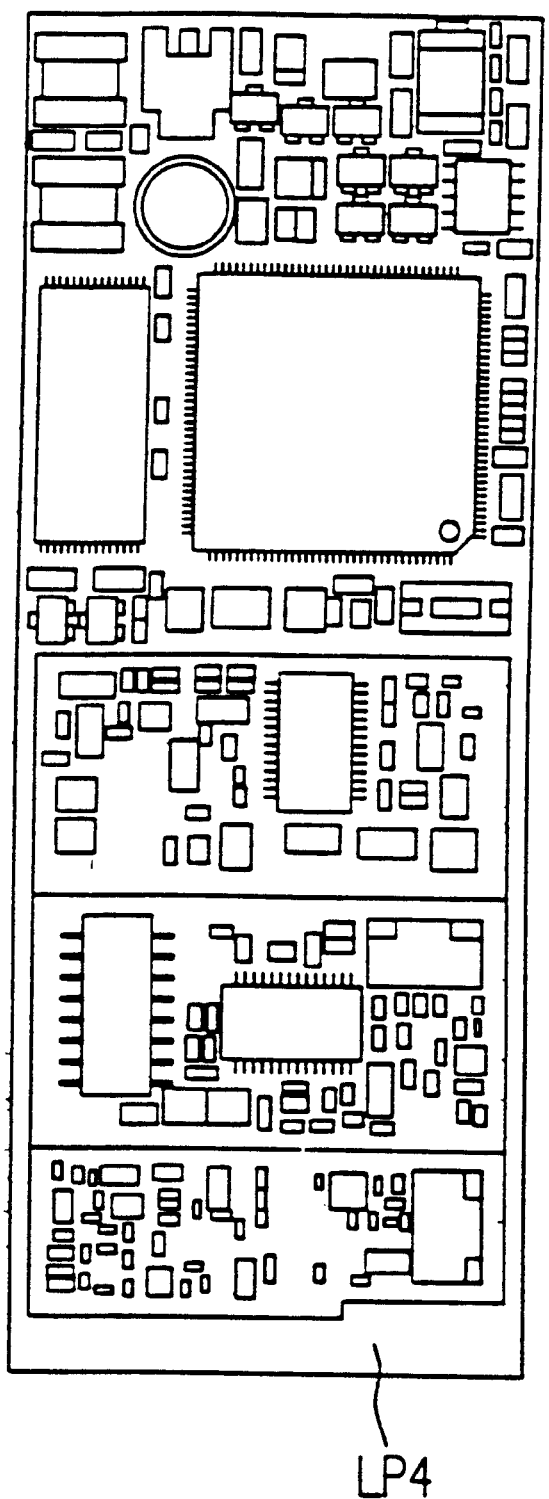
FIG. 9 shows the dimensions of the printed circuit board of FIG. 8.

FIG. 9 shows the dimensions, which can be achieved in this way, of the printed circuit board LP4.

Figure 10:
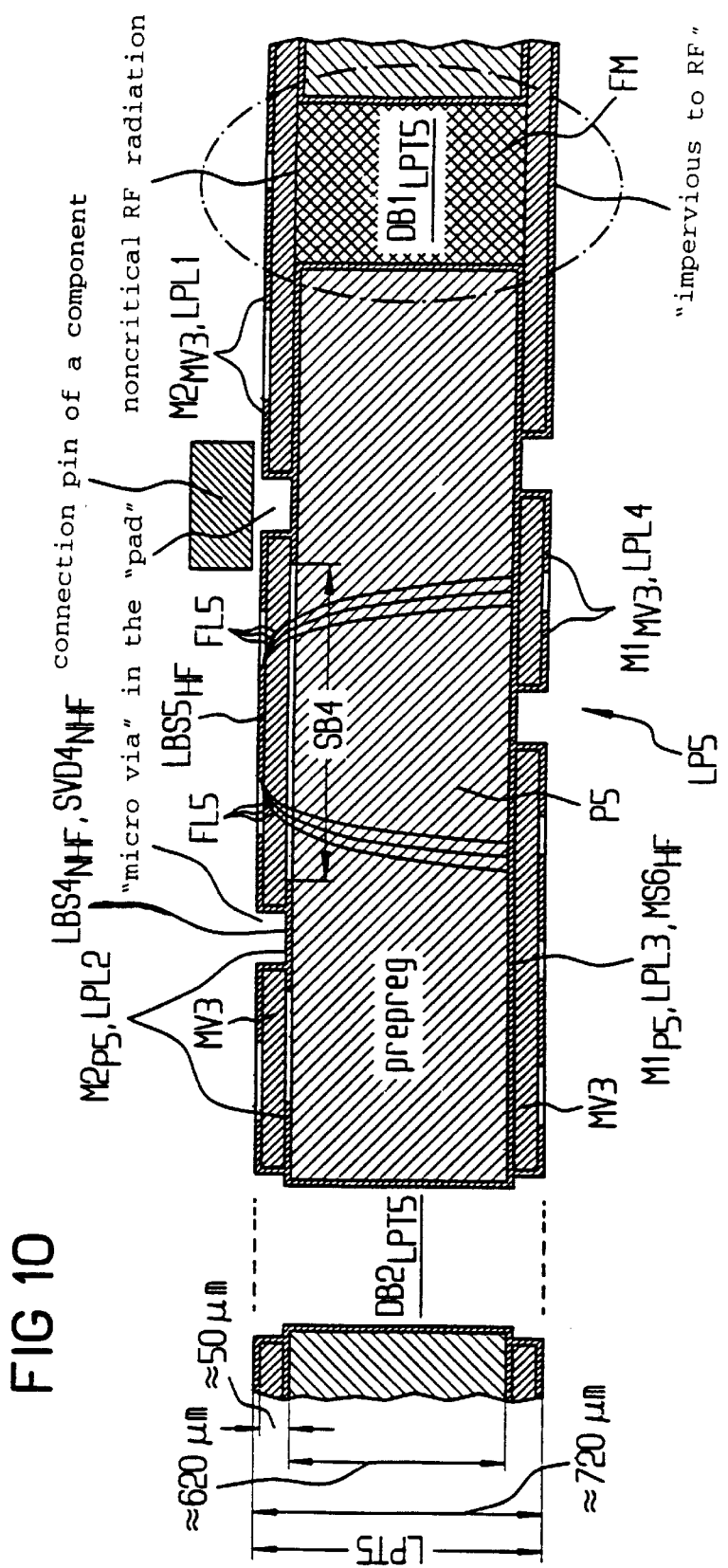
FIG. 10 shows yet another embodiment of a printed circuit board of the present invention.

FIG. 10 shows a fifth printed circuit board LP5, which is slightly modified from the printed circuit board LP3 in FIG. 6 and the printed circuit board LP4 in FIG. 8 and, for production engineering reasons, is preferably again fitted with components on one side. It is again also possible for components to be fitted on both sides here. As shown in the cross sectional illustration in FIG. 10, and by comparison with the multilayer third printed circuit board assembly LPT3, including the six printed circuit board layers LPL1 . . . LPL6, in FIG. 6 and the fourth printed circuit board assembly LPT4 in FIG. 8, the printed circuit board LP5 has a multilayer fifth printed circuit board assembly LPT5, which includes four printed circuit board layers LPL1 . . . LPL4, again has a thickness of approximately 1400 μm and whose printed circuit board layers LPL2 . . . LPL3 are again preferably constructed using the known hybrid masslam process, whilst the printed circuit board layers LPL1, LPL4 are constructed using MV technology.

Unlike the printed circuit board assemblies LPT3, LPT4, the printed circuit board assembly LPT5 includes a single assembly coating. This makes it possible to reduce production costs in terms of the design of the printed circuit board assembly. The printed circuit board assembly LPT5 contains a fifth "prepreg" coating P5, with a thickness of approximately 620 μm. This "prepreg" coating P5 has, on the underside of the "prepreg" coating P5, a twenty-first metal coating M1$_{P5}$ (third printed circuit board layer LPL3), which is preferably made of copper and is designed as the sixth RF ground coating MS6$_{RF}$. The "prepreg" coating P5 also has on its top a twenty-second metal coating M2$_{P5}$ (second printed circuit board layer LPL2), preferably made of copper. The metal coating M1$_{P5}$, M2$_{P5}$ has a respective third "micro via" coating MV3, with a thickness of, in each case, approximately 50 μm, arranged on it. The "micro via"

coating MV3 arranged on the metal coating M1$_{P5}$ has, on the side opposite the metal coating M1$_{P5}$, a twenty-third metal coating M1$_{MV3}$ (sixth printed circuit board layer LPL4), preferably made of copper and, on the side opposite the metal coating M2$_{P5}$ (first printed circuit board layer LPL1), preferably made of copper. The first printed circuit board layer LPL1 has a critical fifth RF conductor-track structure LBS5$_{RF}$, for example, arranged on it, whilst the second printed circuit board layer LPL2 is provided with a fourth non-RF conductor-track structure LBS4$_{NRF}$ and/or a fourth non-RF circuit interconnection SVD4$_{NRF}$, for example. To protect the RF conductor-track structure LBS5RF in relation to the RF ground coating MS6$_{RF}$ int he third printed circuit board layer LPL3 against the influence of the non-RF conductor-track structure LBS4$_{NRF}$ and/or the non-RF circuit interconnection SVD4$_{NRF}$, the second printed circuit board layer LPL2 is provided with a fourth barrier area SB4, which amply surrounds fourth field lines FL5 of the RF signal.

The RF conductor-track structure LBS4$_{RF}$ also may be, again alternatively or additionally, arranged in the second printed circuit board layer LPL2, the third printed circuit board layer LPL3 and/or the fourth printed circuit board layer LPL4. In the latter instance, the barrier area logically would have to be situated int he third printed circuit board layer LPL3. In the first two instances, the barrier areas would be situated in the first printed circuit board layer LPL1 and in the fourth printed circuit board layer LPL4, respectively.

Furthermore, the printed circuit board assembly LPT5 has first through holes DB1$_{LPTS}$ for RF connections and non-RF connections between the first printed circuit board layer LPL1 and the fourth printed circuit board layer LPL4, as well as second through holes DB2$_{LPTS}$ for connecting external modules (e.g. audio unit, microphone, etc.). In contrast to the circumstances in FIG. 6, and in line with the circumstances in FIG. 8, the through holes DB1$_{LPTS}$ are as illustrated closed by the "micro via" coating MV3 with the metal coating M1$_{MV3}$ and with the metal coating M2$_{MV3}$. Whilst this measure creates additional space for RF circuits and RF conductor-track structures on the metal coating M2$_{MV3}$ (Fourth increase in the packing density), the fact that the metal coating M1$_{MV3}$ is designed as a continuous ground coating means that the holes are made "impervious to RF" on the metal coating M1$_{MV3}$, so that no RF radiation produced by the RF circuits and RF conductor-track structures on the printed circuit board can now leak from this part of the hole opening. Since an RF circuit or an RF conductor-track structure is placed over the other hole opening, the RF radiation leaking from this is not critical.

So that the hole DB$_{LPT4}$ covered in this way does not blow when covered as a result of the microconditioning this produces in the hole, the hole is preferably filled up with the filling material FM.

Although the present invention has been described with reference to specific embodiments, those of skill in the art will recognize that changes may be made thereto without departing from the spirit and scope of the invention as set forth in the hereafter appended claims.

I claim:

1. A printed circuit board for electrical devices having RF components, particularly for mobile radio telecommunication devices, wherein the printed circuit board has RF circuits, non-RF circuits, RF conductor-track structures and non-RF conductor-track structures arranged on it, the printed circuit board comprising:

an assembly having both first and second outer coatings formed on respectively opposite sides of the assembly, and further having a plurality of holes which penetrate both the first and second outer coatings;

a micro via coating applied to at least part of a surface of at least one of the first and second outer coatings, wherein components of both the RF circuits and the non-RF circuits arranged on the micro via coating, and wherein both the RF conductor-track structure and the non-RF conductor-track structures and arranged on at least one of the micro via coating and the first and second outer coatings;

a plurality of barrier areas arranged on at least one of the micro via coating and the first and second outer coatings for the non-RF circuits and the non-RF conductor-tack structures wherein RF properties of the RF circuits and the RF conductor-track structures arranged above and below the barrier areas in relation to an RF ground coating of the assembly are protected; and a plurality of circuit interconnections arranged on at least one of the micro via coating and the first and second outer coatings.

2. A printed circuit board for electrical devices having RF components as claimed in claim 1, wherein a distance between the first and second outer coatings and the micro via coating is such that the micro via coating may be produced using a Sequential Built Up process.

3. A printed circuit board for electrical devices having RF components as claimed in claim 1, wherein a distance between the first and second outer coatings and the micro via coating is such that the micro via coating may be produced by laser drilling using a $CO_2$.

4. A printed circuit board for electrical devices having RF components as claimed in claim 1, wherein a distance between the first and second outer coatings and the micro via coating is such that the micro via coating may be produced using a Silver Bump process.

5. A printed circuit board for electrical devices having RF components as claimed in claim 1, wherein a distance between the first and second outer coatings and the micro via coating is 50 $\mu$m.

6. A printed circuit board for electrical devices having RF components as claimed in claim 1, wherein first holes of the plurality of holes are covered by the micro via coating without the barrier areas, and at least one of an RF circuit and a metal coating is applied to the micro via coating covering the first holes.

7. A printed circuit board for electrical devices having RF components as claimed in claim 6, wherein the first holes are filled with a filling material.

8. A printed circuit board for electrical devices having RF components as claimed in claim 1, wherein the assembly is a multilayer assembly.

9. A printed circuit board for electrical devices having RF components as claimed in claim 8, wherein the multilayer assembly is designed using a hybrid masslam process.

10. A printed circuit board for electrical devices having RF components as claimed in claim 1, wherein the printed circuit board is used in a DECT telecommunication device.

11. A printed circuit board for electrical devices having RF components as claimed in claim 1, wherein the printed circuit board is used in a GSM telecommunication device.

12. A printed circuit board for electrical devices having RF components as claimed in claim 1, wherein the printed circuit board is used in a PHS telecommunication device.

13. A printed circuit board for electrical devices having RF components as claimed in claim 1, wherein the printed circuit board is used in an IS-95 telecommunication device.

14. A printed circuit board for electrical devices having RF components as claimed in claim 1, wherein the printed circuit board is used in a radio telecommunication device based on a pure or hybrid transmission method from the basic transmission methods RDMA, TDMA and CDMA.

* * * * *